US006168992B1

United States Patent
Lee (10) Patent No.: US 6,168,992 B1
(45) Date of Patent: Jan. 2, 2001

(54) METHODS FOR FORMING ELECTRODES INCLUDING SACRIFICIAL LAYERS

(75) Inventor: Kyu-Hyun Lee, Kyunggi-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/181,288

(22) Filed: Oct. 28, 1998

(30) Foreign Application Priority Data

Mar. 30, 1998 (KR) .................................. 98-10991

(51) Int. Cl.$^7$ .............................................. H01L 21/8242

(52) U.S. Cl. ......................... 438/256; 438/253; 438/396; 438/399

(58) Field of Search ................... 438/253, 256, 438/396, 399, 6, FOR 356, FOR 368

(56) References Cited

U.S. PATENT DOCUMENTS

| | | | |
|---|---|---|---|
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | 437/109 |
| 5,394,012 | 2/1995 | Kimura | 257/739 |
| 5,405,801 | 4/1995 | Han et al. | 437/60 |
| 5,464,791 | 11/1995 | Hirota | 437/60 |
| 5,486,488 | 1/1996 | Kamiayama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,616,511 | 4/1997 | Hirota | 438/396 |
| 5,623,243 | 4/1997 | Watanabe et al. | 257/309 |
| 5,643,819 | 7/1997 | Tseng | 437/60 |

(List continued on next page.)

FOREIGN PATENT DOCUMENTS

| | | | |
|---|---|---|---|
| 2 321 776 | 8/1998 | (GB) | H01L 21/8242 |
| 4286151 | 10/1992 | (JP) . | |

OTHER PUBLICATIONS

Wolf et al, "Silicon Processing, Process technology", Lattice Press, 1986, vol. I, pp. 553 and 579.*
Watanabe, H., et al., A. New Cylindrical Capacitor Using Hemispherical Grained Si (HSG–Si) for 256 Mb DRAMs, *IEEE*, pp. 10.1.1–10.1.4 (1992).
Watanabe, H., et al., An Advanced Fabrication Technology of Hemispherical Grained (HSG) Poly–Si for High Capacitance Storage Electrodes, *1991 International Conference on Solid State Devices and Materials, Yokohama*, pp. 478–480 (1991).
Watanabe, H., et al., Hemispherical Grained Silicon (HSG–Si) Formation on In–Situ Phosphorous Doped Amorphous–Si Using the Seeding Method, *1992 International Conference on Solid State Devices and Materials, Tsukuba*, pp. 422–424 (1992).

* cited by examiner

*Primary Examiner*—George Fourson
*Assistant Examiner*—Joannie A. Garcia
(74) *Attorney, Agent, or Firm*—Myers Bigel Sibley & Sajovec (57) ABSTRACT

A method for fabricating a Dynamic Random Access Memory (DRAM) device includes the steps of forming a word line on a substrate, forming a first insulating layer on the substrate and on the word line, forming a bit line the first insulating layer, and forming a second insulating layer on the first insulating layer and on the bit line. A sacrificial layer is formed on the second insulating layer, and a contact hole is formed through the sacrificial layer, and the first and second insulating layers. A conductive plug is formed in the contact hole, and the sacrificial layer is removed thereby exposing upper side portions of the conductive plug to define a capacitor electrode.

29 Claims, 12 Drawing Sheets

U.S. PATENT DOCUMENTS 5,668,038 * 9/1997 Huang et al. .
5,677,222 * 10/1997 Tseng .
5,693,557 * 12/1997 Hirao et al. .
5,714,401   2/1998 Kim et al. ............................ 437/52
5,726,083 * 3/1998 Takaishi .
5,728,618 * 3/1998 Tseng .
5,733,808 * 3/1998 Tseng .
5,869,382 * 2/1999 Kubota .
5,926,709 * 7/1999 Aisou et al. .

METHODS FOR FORMING ELECTRODES INCLUDING SACRIFICIAL LAYERS

FIELD OF THE INVENTION

The present invention relates to the field of microelectronics and more particularly to methods of forming electrodes for microelectronic devices.

BACKGROUND

With continued increases in integration densities of Dynamic Random Access Memory (DRAM) devices, steps used to fabricate DRAM memory cell capacitors with high capacitances are becoming more complicated and difficult. In addition, alignment between the storage electrode contact hole and the storage electrode is more difficult to provide. In other words, while a diameter of the storage electrode contact hole is reduced to occupy a smaller area, a surface area of the capacitor is desirably increased to provide a high capacitance.

In particular, methods have been developed to form Hemi-Spherical Grain (HSG) silicon layers on storage electrodes to increase surface areas thereof. With HSG silicon layers, however, it may be necessary that extra space be provided between storage electrodes so that bridging does not occur between electrodes when forming the HSG layer. Otherwise, bridging between electrodes may result in double-bit and multi-bit failures.

An overlap margin between a storage electrode contact hole and a storage electrode may thus be reduced so that a polysilicon layer formed in a storage electrode contact hole is etched during storage electrode poly-etching. If the degree of etching is serious, the polysilicon in the contact hole may be severely etched, and an undesirably high resistance between the capacitor storage electrode and the memory cell access transistor may result.

SUMMARY OF THE INVENTION

It is therefore an object of the present invention to provide improved methods of fabricating microelectronic electrodes.

It is another object of the present invention to provide improved methods of fabricating microelectronic capacitor structures.

It is still another object of the present invention to provide improved methods of fabricating dynamic random access memory devices.

These and other objects are provided according to the present invention by forming a sacrificial layer on a substrate, forming a contact hole through the sacrificial layer, and forming a conductive plug in the contact hole. The sacrificial layer is then removed thereby exposing upper side portions of the conductive plug and defining an electrode. An electrode with sidewalls is thus provided thereby increasing the surface area of the electrode. More particularly, the step of forming the sacrificial layer can be preceded by the steps of forming an insulating layer on the substrate, and forming an etch stop layer on the insulating layer wherein the contact hole is formed through the sacrificial layer, the etch stop layer, and the insulating layer. The electrode and the conductive via are thus provided simultaneously with improved alignment therebetween. In other words, the portion of the conductive plug in the insulating layer provides the conductive via, and the portion of the conductive plug in the sacrificial layer provides the electrode.

According to a particular embodiment of the present invention, methods are provided for fabricating a Dynamic Random Access Memory (DRAM) device. These methods include the steps of forming a word line on a substrate, forming a first insulating layer on the substrate and on the word line, forming a bit line on the first insulating layer, and forming a second insulating layer on the first insulating layer and on the bit line. A sacrificial layer is formed on the second insulating layer, and a contact hole is formed through the sacrificial layer, and the first and second insulating layers. A conductive plug is formed in the contact hole, and the sacrificial layer is removed thereby exposing upper side portions of the conductive plug to define a capacitor electrode. In addition, a dielectric layer can be formed on the exposed portions of the conductive plug, and a conductive layer can be formed on the dielectric layer opposite the conductive plug to provide a capacitor structure.

More particularly, the step of forming the sacrificial layer can be preceded by the step of forming an etch stop layer on the second insulating layer opposite the substrate, and the step of forming the contact hole can include forming the contact hole through the etch stop layer. The etch stop layer can be a layer of a material that generates a polymer during the step of forming the contact hole so that a width of the contact hole through the sacrificial layer can be greater than a width of the contact hole through the first and second insulating layers. For example, the etch stop layer can be a layer of a material such as polycrystalline silicon or silicon nitride. The etch stop layer can be removed after removing the sacrificial layer, and the etch stop layer can have a thickness in the range of 500 Ångstroms to 1500 Ångstroms. The sacrificial layer can have a thickness in the range of 8,000 Ångstroms to 12,000 Ångstroms.

According to the methods of the present invention, a conductive plug can be formed in a contact hole through a sacrificial layer and an insulating layer, and the sacrificial layer can be removed to simultaneously provide both an electrode and a conductive via. Because a single photolithography step can be used to define the contact hole through both the sacrificial and insulating layers, alignment of the electrode and the conductive via can be improved.

BRIEF DESCRIPTION OF THE DRAWINGS

This invention may be understood and its objects will become apparent to those skilled in the art by reference to the accompanying drawings as follows.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of the layers and regions are exaggerated for clarity. It will also be understood that when a layer is referred to as being "on" another layer or substrate, it can be directly on the other layer or substrate, or intervening layers may also be present.

An embodiment of the invention will now be described with reference to FIGS. 1A–F and FIGS. 2A–F. FIGS. 1A to 1F are cross sectional views illustrating steps of a method of fabricating a DRAM cell capacitor according to a preferred embodiment of the present invention, wherein the cross-sectional views are taken along a direction parallel with a cell word line. FIGS. 2A to 2F are cross sectional views illustrating steps of a method of fabricating the DRAM cell capacitor according to the method of FIGS. 1A to 1F, wherein sectional views are taken along a direction parallel with a bit line. Moreover, the steps of FIGS. 1A to 1F respectively correspond to the steps of FIGS. 2A to 2F.

Figure 1A:
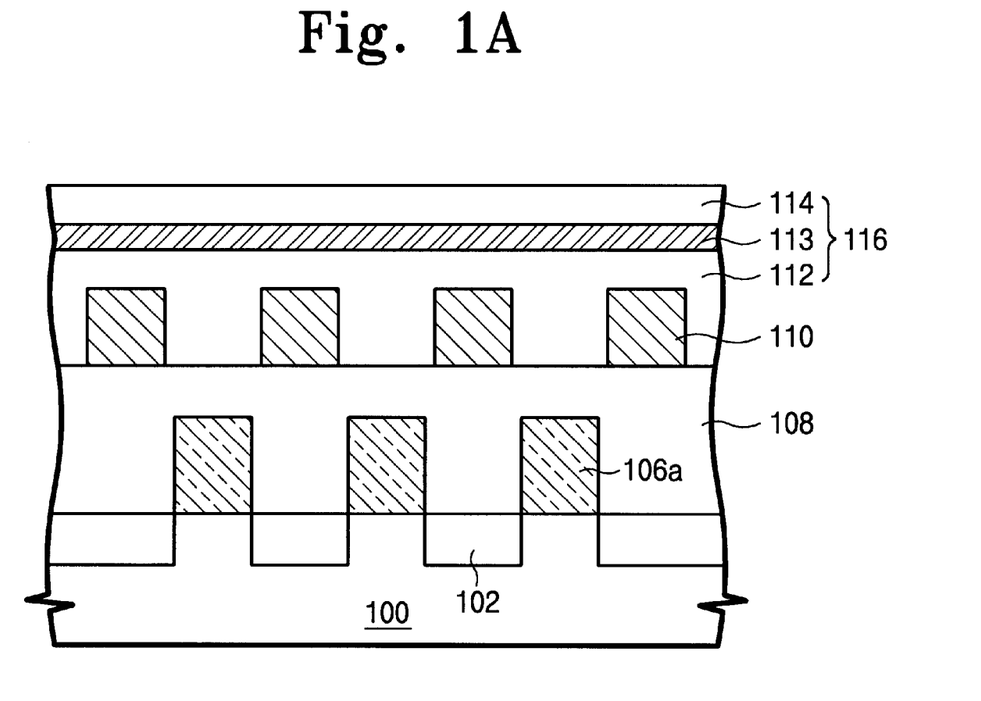
FIGS. 1A to 1F are cross sectional views illustrating steps of a method of fabricating a DRAM cell capacitor according to the present invention, wherein the cross-sectional views are taken along a direction parallel with a cell word line.
Figure 2A:
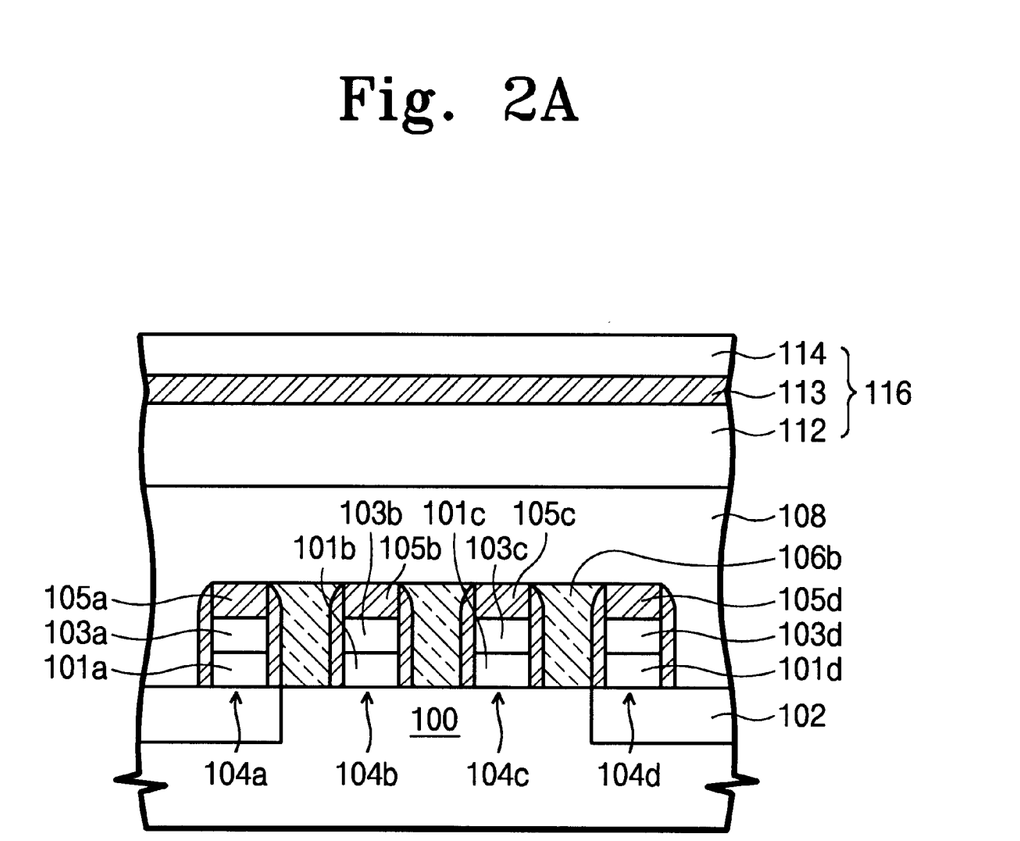
FIGS. 2A to 2F are cross sectional views illustrating steps of the method of fabricating a DRAM cell capacitor according to FIGS. 1A to 1F, wherein the cross-sectional views are taken along a direction parallel with a bit line.

Referring to FIG. 1A and FIG. 2A, a device isolation region 102 is formed on a semiconductor substrate 100 to define active and inactive regions thereof. Memory cell transistors including gate electrodes 104a–104d and source/drain regions are formed on the semiconductor substrate 100.

The gate electrodes 104a–104d include respective gate insulating layers 101a–d, conductive layers 103a–d such as polysilicon layers, and capping layers 105a–d. The capping layers 105a–d preferably comprise a material wherein the first insulating layer 108 can be selectively etched with respect to the capping layers. For example, the capping layers can be silicon nitride (SiN) layers. The silicon nitride capping layers can thus function as etch stops during a subsequent step of forming a contact hole through the first insulating layer 108 which can be a silicon oxide layer.

A bit line contact pad 106a and a storage electrode contact pad 106b are formed respectively on the semiconductor pad 106b. The storage electrode contact pad 106b is interposed between the gate electrodes 104a–104d. The first insulating layer 108 is formed on the semiconductor substrate 100 including the contact pads 106a and 106b. The first insulating layer 108 can be an oxide layer having flat upper surface. Bit lines 110 are formed on the first insulating layer 108, and a second insulating layer 116 having flat upper surface is formed on the first insulating layer 108 and on the bit line 110.

The insulating layer 116 can include oxide layers 112 and 114, and silicon nitride layer 113 therebetween. The oxide layer 114 over the silicon nitride layer 113 can act as an etch stop when a polycrystalline silicon spacer is formed on the insulating layer 116 and etched. In addition, the oxide layer 114 can reduce exposure of the silicon nitride layer 113. In other words, when an HSG silicon layer is grown, the silicon nitride layer 114 can reduce formation of HSG seeds on the storage electrode.

Figure 1B:
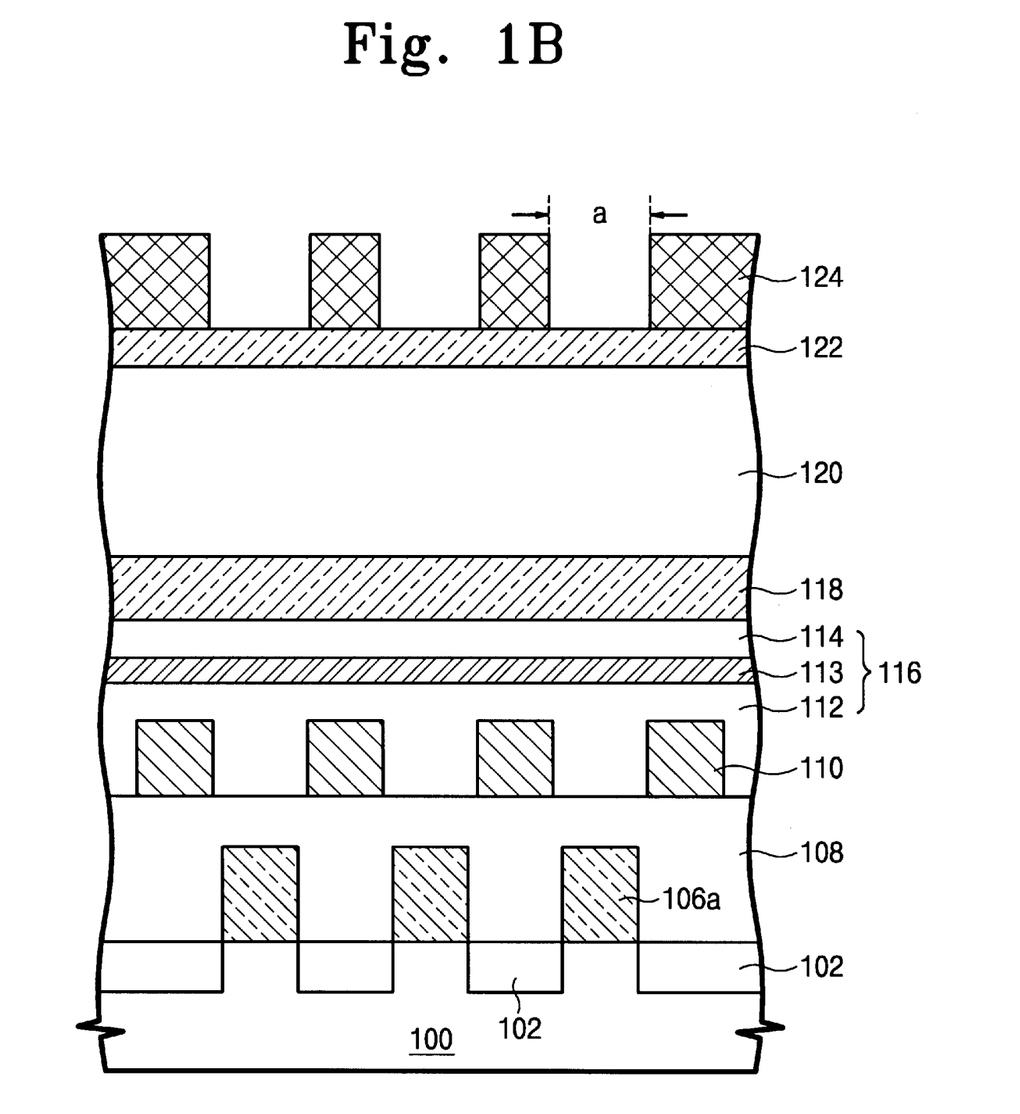
Figure 2B:
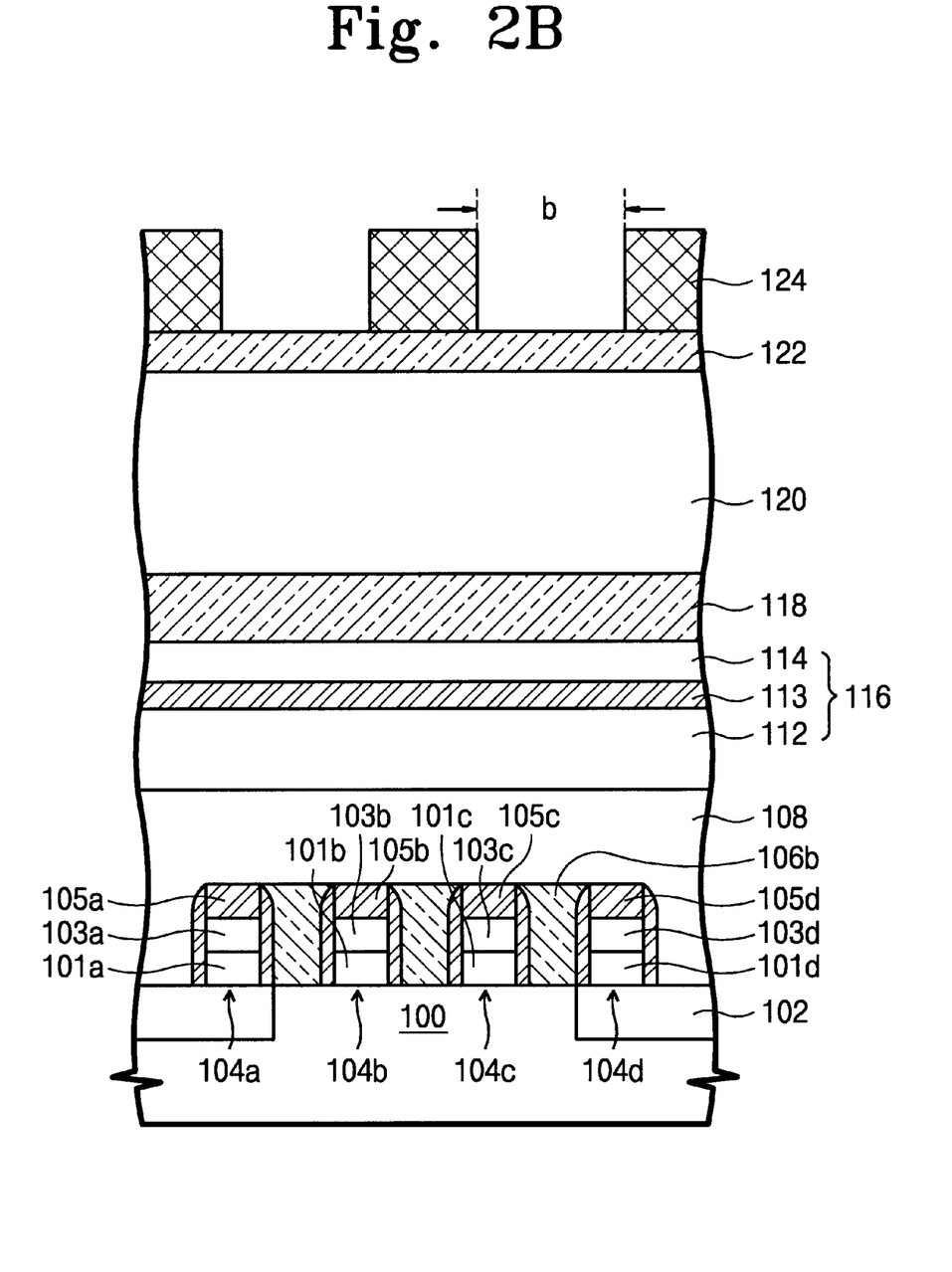

In FIG. 1B and FIG. 2B, an etch stop layer 118 is formed on the second insulating layer 116. The etch stop layer 118 is preferably a layer of a material which can generate a polymer during a subsequent etching step used to form a contact hole. The etch stop layer 118, for example, can be a layer of a material such as doped polysilicon or silicon nitride.

A sacrificial layer 120 and a barrier layer 122 are sequentially formed on the etch stop layer 118. The sacrificial layer 120, for example, can be an oxide layer, and this layer can have a thickness the same as or greater than a thickness of the subsequently formed storage electrodes. The thickness of the sacrificial layer 120 can be varied according to a desired thickness of the memory cell capacitor storage electrodes. Preferably, the sacrificial layer 120 has a thickness in the range of 8,000Å to 12,000Å. The barrier layer 122, for example, can be a layer of a material such as polysilicon or silicon nitride. Preferably, the etch stop layer 118 and the barrier layer 122 both have thicknesses in the range of 500Å to 1500Å.

Figure 1C:
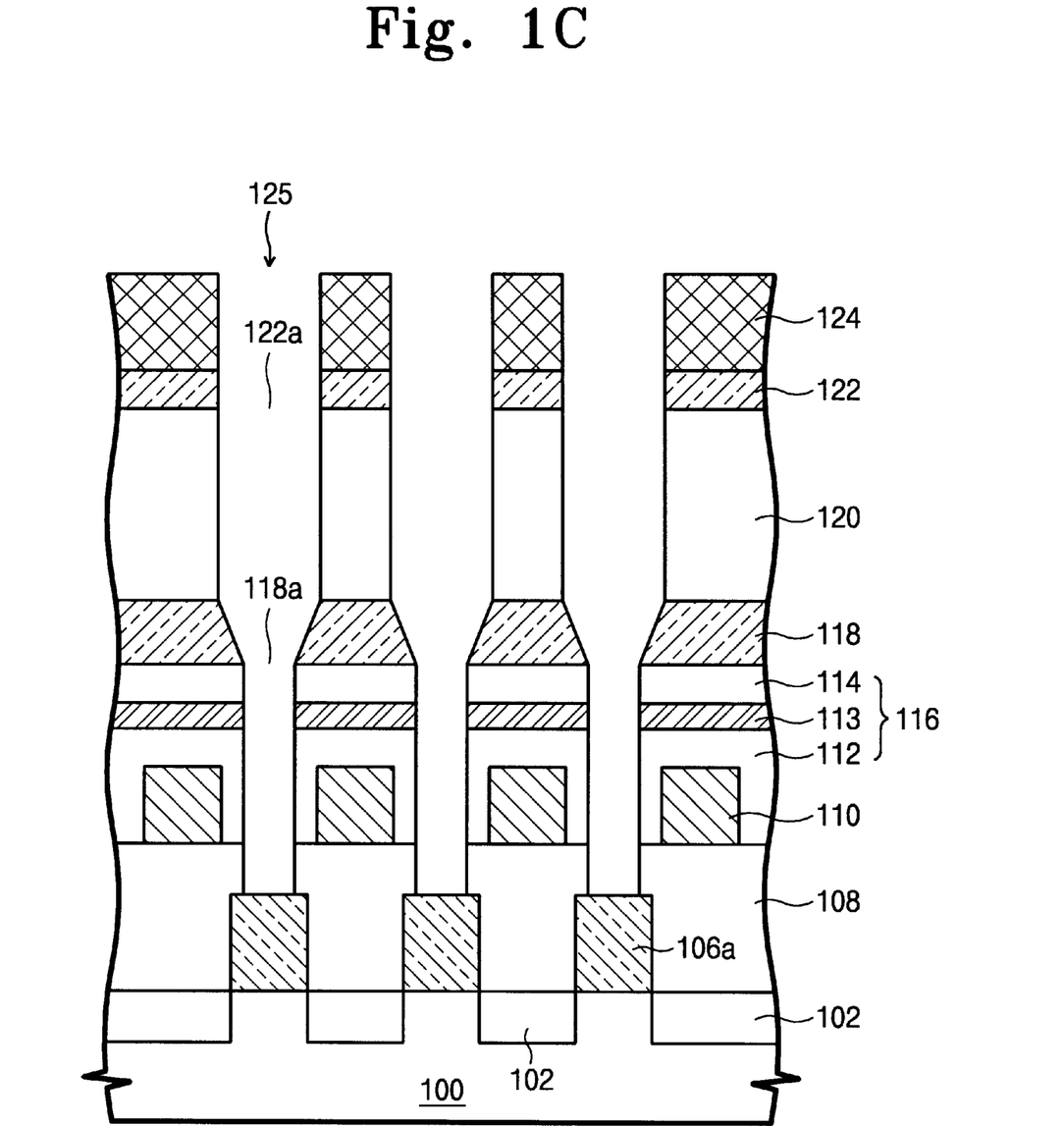
Figure 2C:
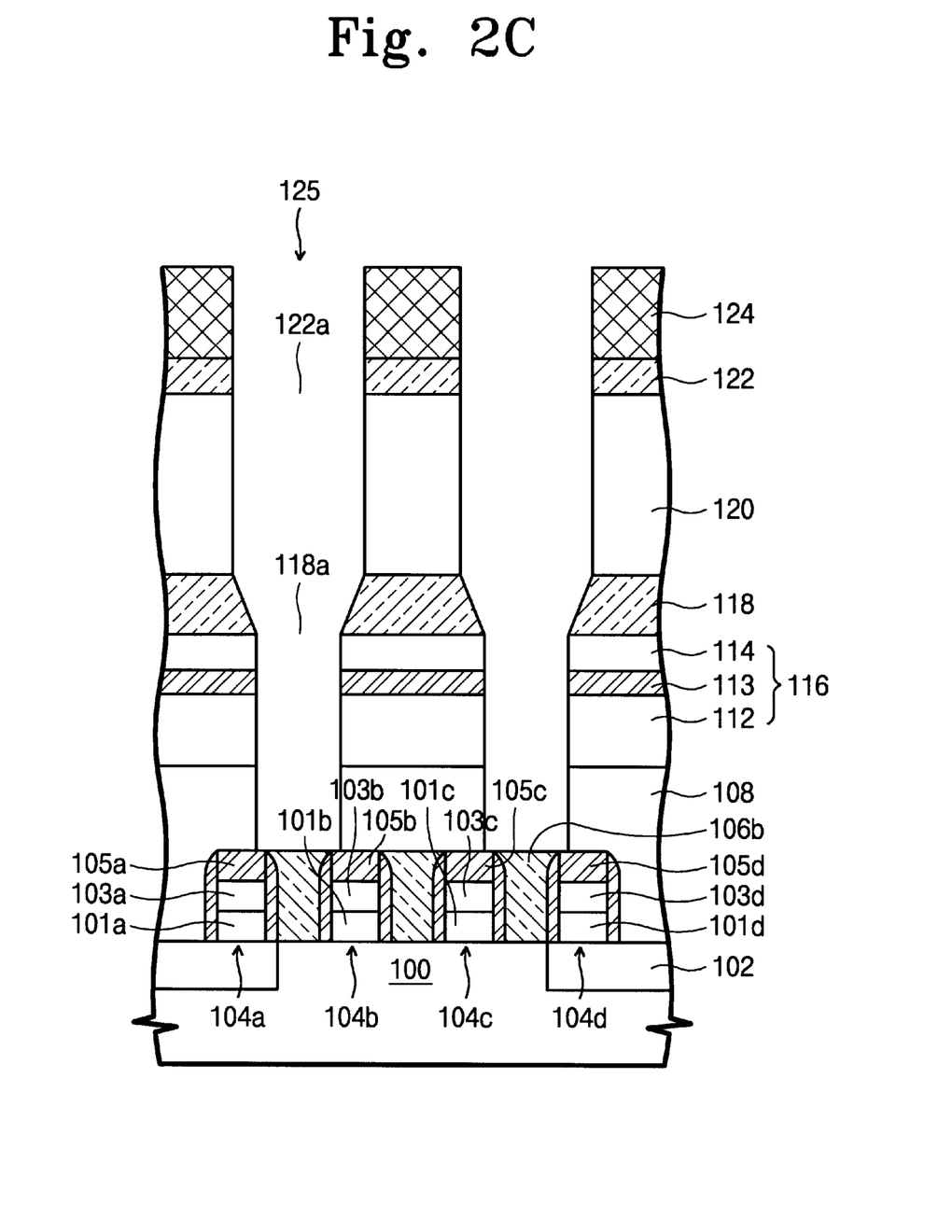

A mask pattern 124, such as a photoresist mask pattern, is formed on the barrier layer 118 to define contact holes for the memory cell capacitor storage electrode. Preferably, a region defined by the mask pattern 124 is formed so that the width of an opening in the bit line direction (a) is larger than the width of the opening in the word line direction (b). The barrier layer 122, the sacrificial layer 120, the etch stop layer 118, the second insulating layer 116, and the first insulating layer 108 are then sequentially etched using the mask pattern 124. As shown in FIGS. 1C and 2C, contact holes 125 are formed to provide the memory cell capacitor contact holes.

More particularly, the barrier layer 122 is first etched using the mask pattern 124 as a mask thereby exposing portions of the surface of the sacrificial layer 120. At least one first opening 122a is thus formed. The sacrificial layer 120 is etched to have a vertical profile, using the barrier layer 118 as an etch stop layer. At this time, the barrier layer 122 prevents a diameter of the first opening 122a from increasing when the sacrificial layer 120 is etched. In other words, as the barrier layer 122 is made of a material layer having a higher etch selectivity with respect to the sacrificial layer 120, the sacrificial layer 120 may have an opening having the same aperture as the first opening 122a.

At least one second opening 118a is formed by etching the etch stop layer 118 using of the mask pattern 124. At this time, a polymer is generated while etching the etch stop layer 118. The polymer can be formed by etching the etch stop layer 118 using an etching gas including fluorine. The etching gas can include a gas such as $CHF_3$ or $CF_4$. The polymer is formed on sidewalls of the second opening 118a when the etch stop layer 118 is etched as discussed above. A lower portion of the second opening 118a thus has an aperture smaller than that of the first opening 122a.

The second insulating layer 116 and first insulating layer 108 are sequentially etched using the mask pattern 124 to form contact holes 125. When the second insulating layer 116 and first insulating layer 108 are etched, contact pads 106a and 106b provide etch stops. In the event that misalignment occurs, the silicon nitride capping layers 105a–d of the gate electrodes 104a–104d provide etch stops to protect the gate electrodes 104a–d.

Figure 1D:
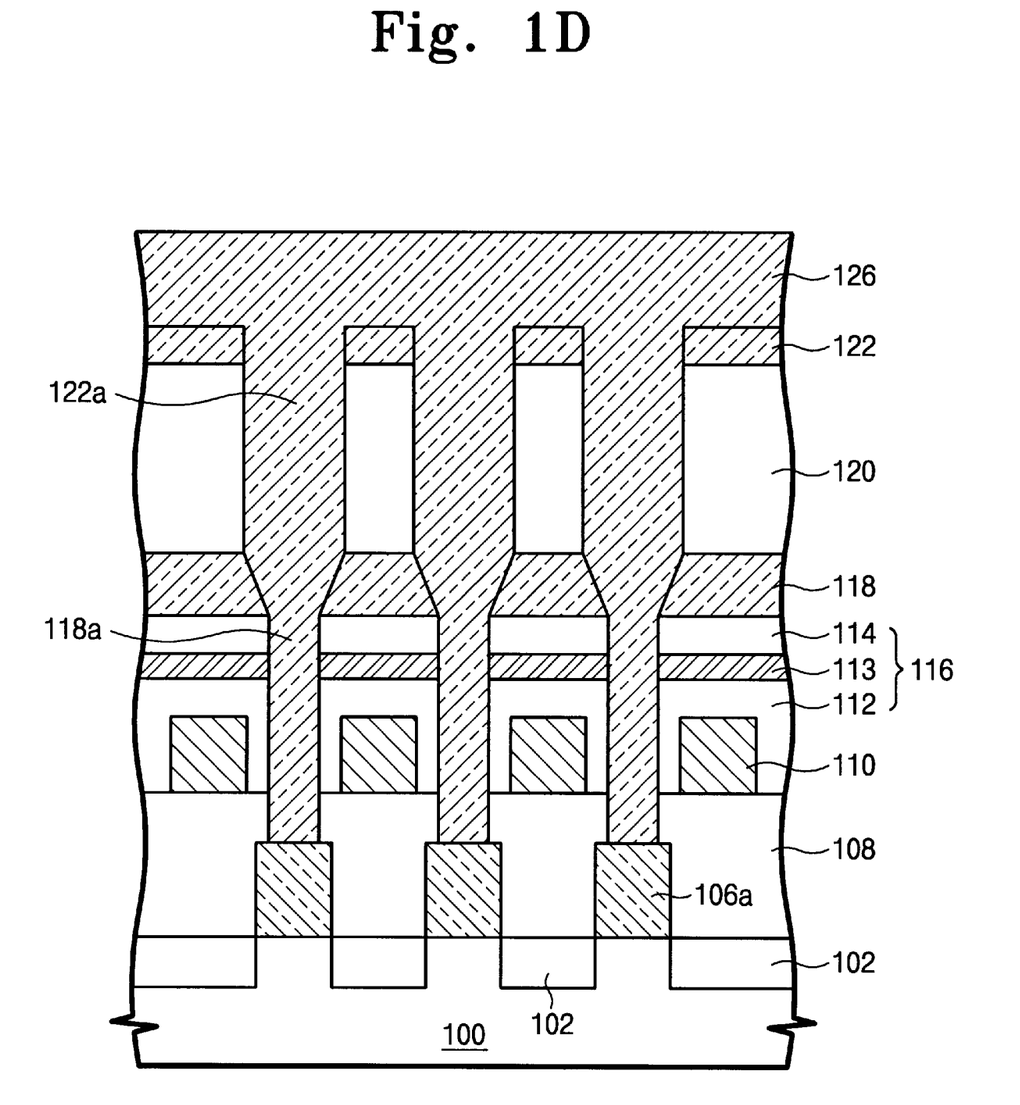
Figure 2D:
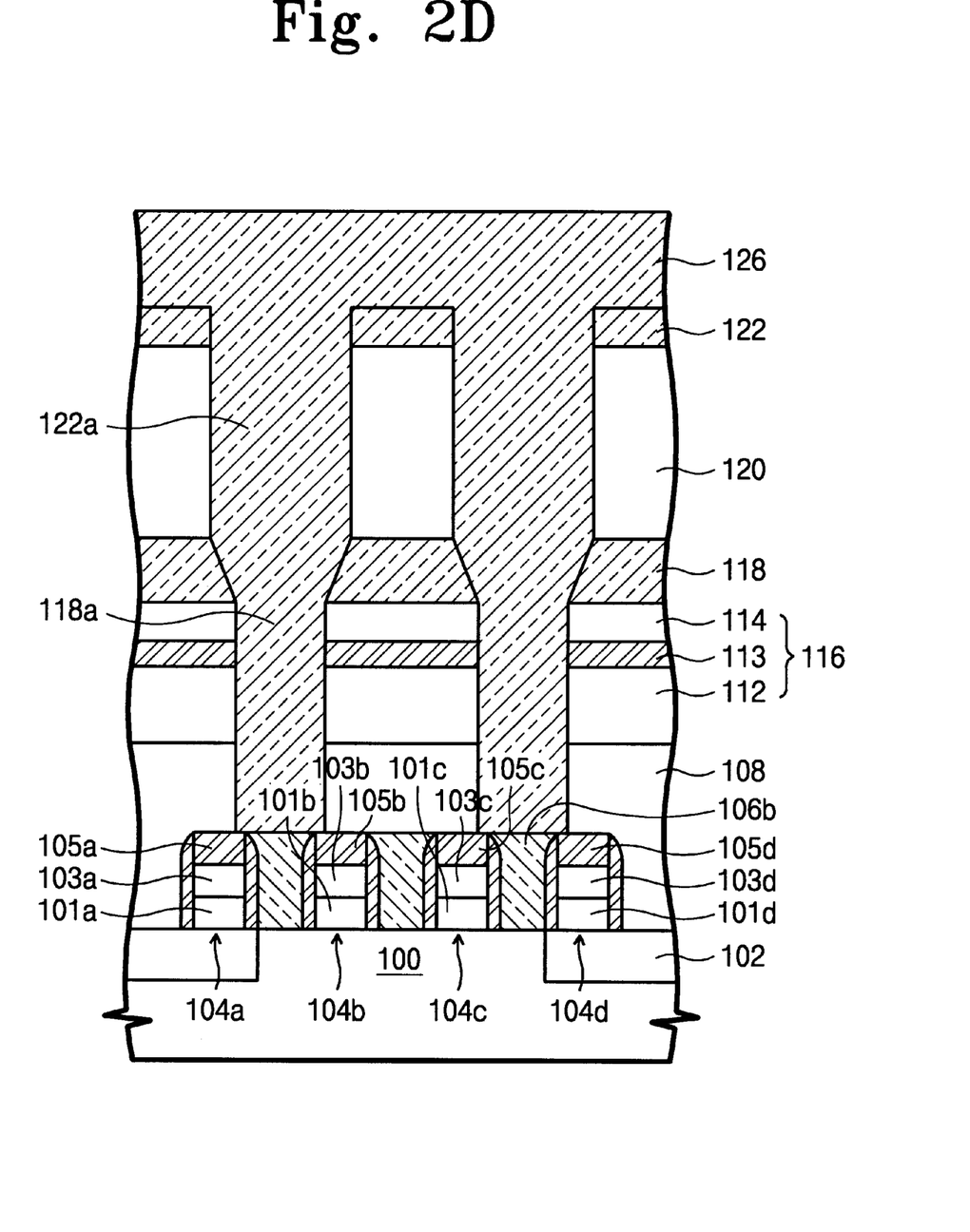

Referring to FIG. 1D and FIG. 2D, after the mask pattern 124 is removed, the contact hole 125 can be filled with the a conductive layer 126. The conductive layer 126, for example, can be a doped polysilicon layer. The barrier layer 122 and the conductive layer 126, are then planarly etched until surface portions of the sacrificial layer 120 are exposed. The planarization-etching can be performed by either etch-back or chemical-mechanical polish (CMP) steps.

Figure 1E:
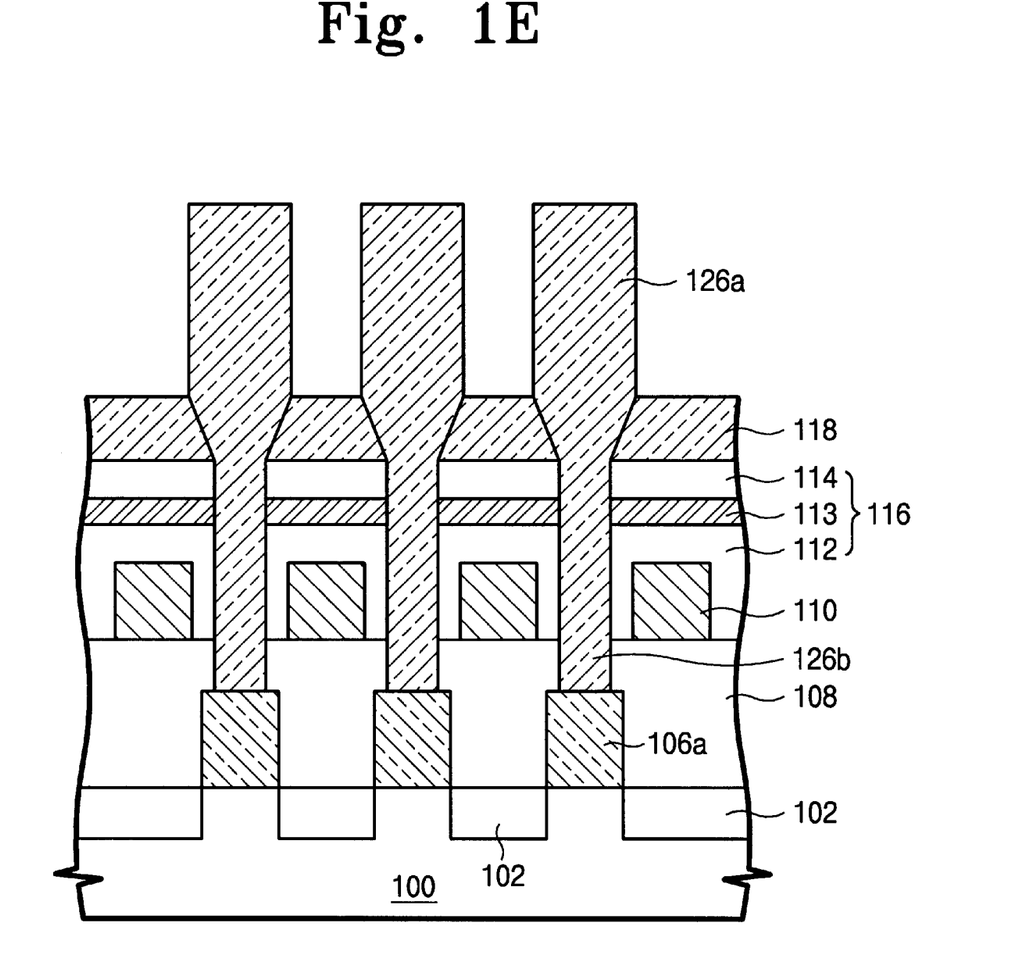
Figure 2E:
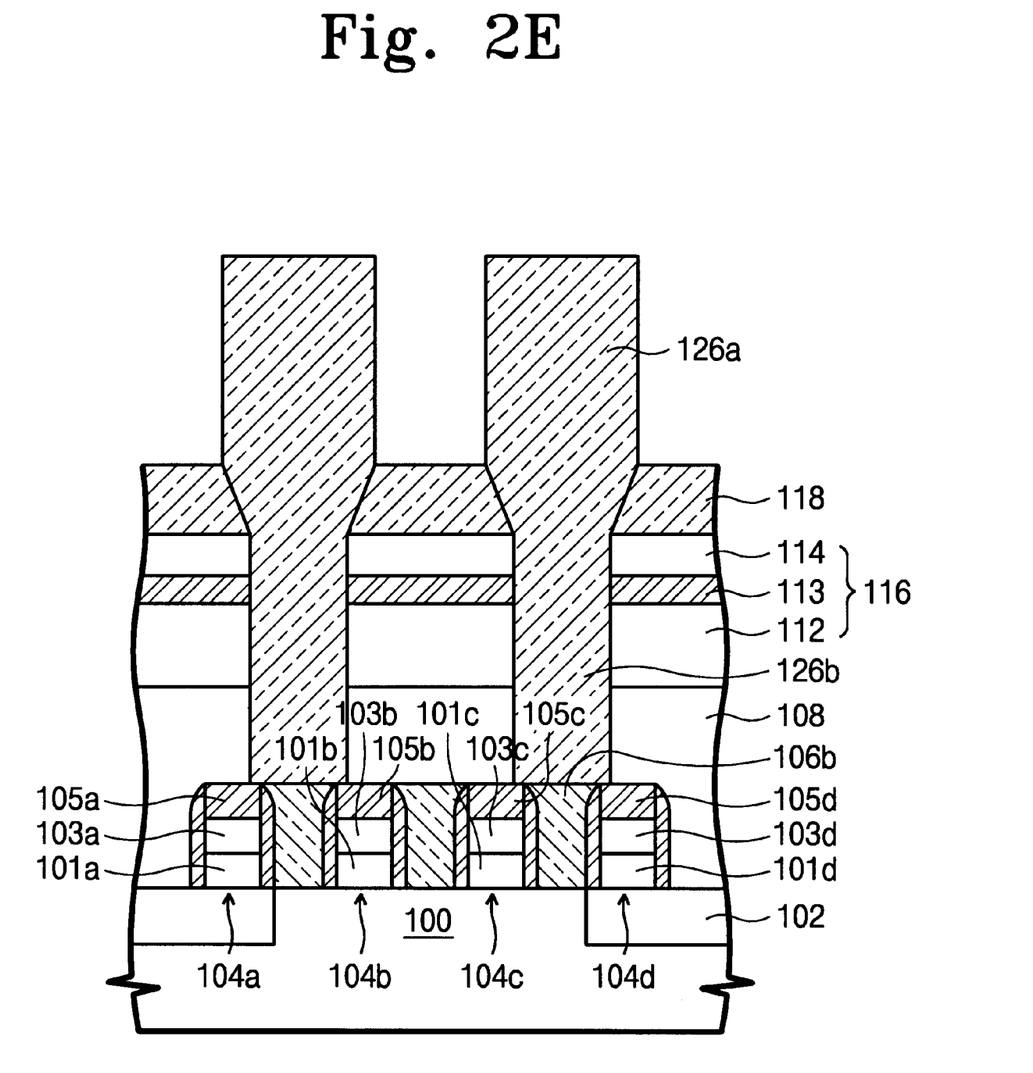

The sacrificial layer 120, which can be an oxide layer, can be removed, for example, using a wet strip step. The sacrificial layer 120 can be removed completely, because the etch stop layer 118 (made of polysilicon or silicon nitride) is provided below. In other words, when the sacrificial layer 120 is removed, the etch stop layer 118 provides an etch stop. As shown in FIGS. 1E and 2E, the storage electrode 126a and the storage electrode contact via 126b are simultaneously formed when the sacrificial layer 120 is removed. The etch stop layer 118 can then be removed using an anisotropic etch, such as an etch back step, to expose surface portions of the second insulating layer 116 adjacent sidewalls of the storage electrode 126a. In the event that the etch stop layer 118 comprises a conductive layer, the etch stop layer 118 must be removed to isolate the storage electrodes. At this time, the second insulating layer 116 may provide an etch stop.

Figure 1F:
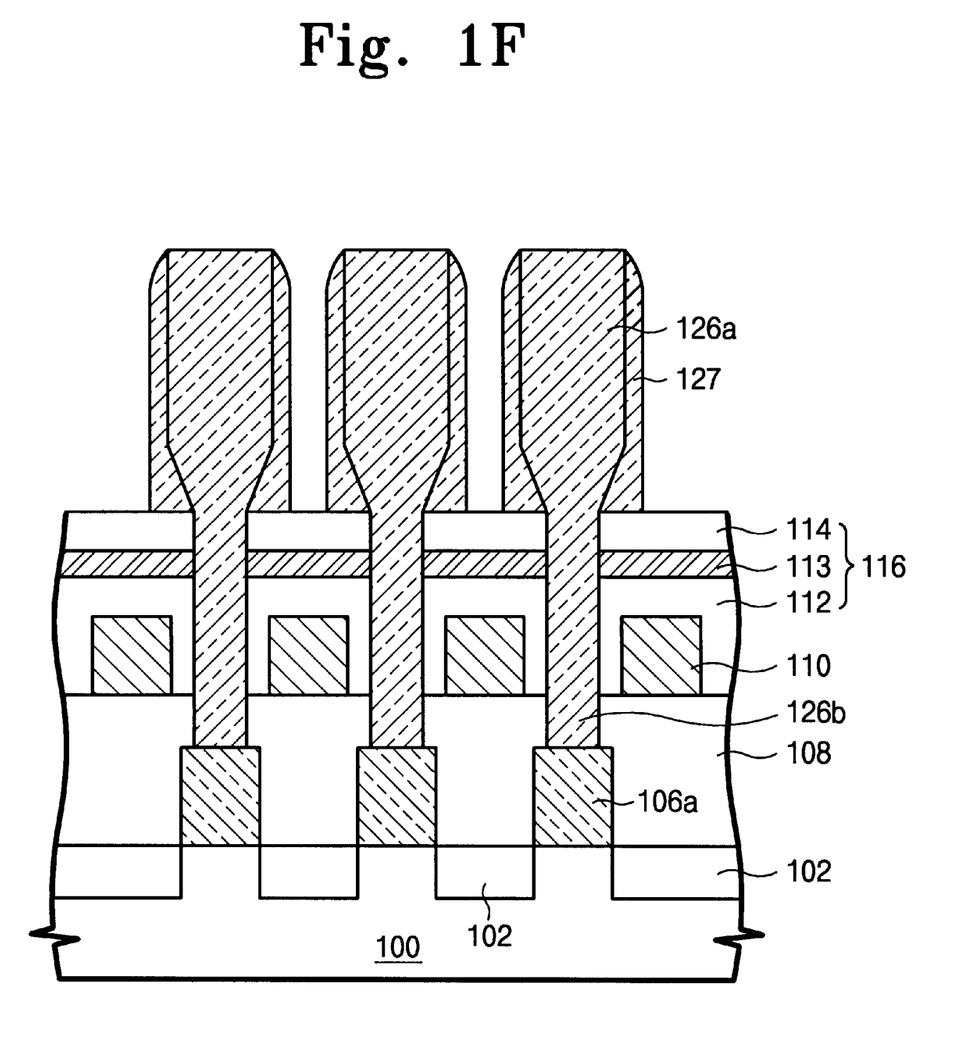
Figure 2F:
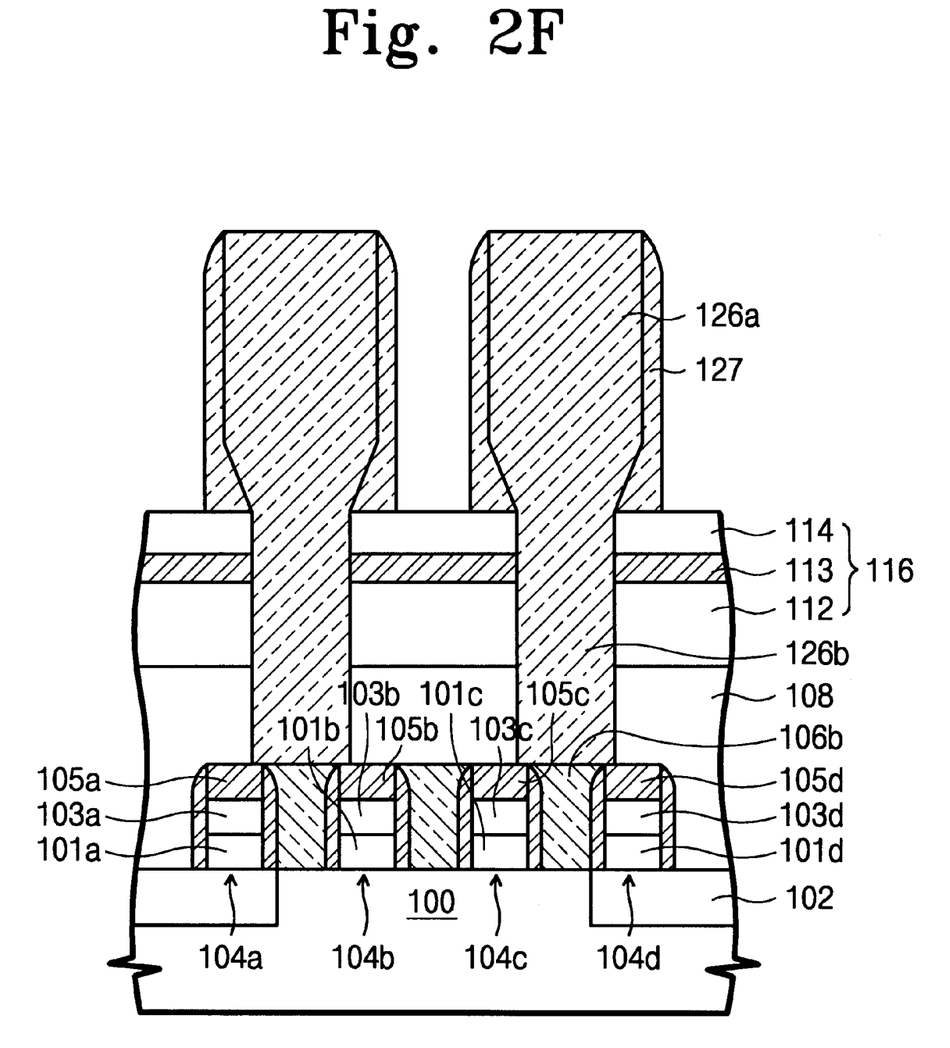

In addition, a conductive layer, such as a doped polysilicon layer, can be formed on exposed portions of the second insulating layer 116 and the storage electrode 126a. The thickness of the above conductive layer is dependent on the space between the storage electrodes 126a. In particular, the thickness of the conductive layer is chosen so that bridges are not formed between the storage electrodes 126a when a subsequently formed HSG layer is formed. As shown in FIGS. 1F and 2F, the conductive layer can be etched using an anisotropic etch (such as an etch back) to provide the storage electrode spacer 127 (polysilicon spacer) on sidewalls of the storage electrode 126a. In other words, portions of the conductive layer are removed from the insulating layer 116 between the storage electrodes. At this time, the second insulating layer 116 can be used as an etch stop layer.

The storage electrode spacer 127 is provided to increase a surface area of the storage electrode 126a, thus increasing the cell capacitance. The electrode spacer 127 can also provide improved step coverage when a capacitor dielectric layer and plate polysilicon layer are deposited in the subsequent steps. In addition, an HSG silicon layer can be grown on the surface of the storage electrode 126a or on the surface of the storage electrode 126a including the storage electrode spacer 127 to further increase the surface are thereof. The formation of HSG silicon layers is discussed, for example, in the reference by H. Watanabe et al. entitled "A New Cylindrical Capacitor Using Hemispherical Grained Si (HSG-Si) for 256 Mb DRAMS." (IDEM 92–259, IEEE, 1992, pp. 259–262.) The disclosure of this reference is hereby incorporated herein in its entirety by reference. The present invention can be applied not only to a method of fabricating a DRAM cell capacitor but can also be generally applied to a method of fabricating a landing pad on an upper portion of a contact hole.

In the drawings and specification, there have been disclosed typical preferred embodiments of the invention, and although specific terms are employed, they are used in a generic sense only and not for purposes of limitation, the scope of the invention being set forth in the following claims.

That which is claimed is:

1. A method for fabricating a DRAM cell capacitor comprising the steps of:

forming a gate electrode on a semiconductor substrate;

forming a first insulating layer on the semiconductor substrate and on the gate electrode;

forming a bit line on the first insulating layer;

forming a second insulating layer on the first insulating layer and on the bit line;

forming an etch stop layer on the second insulating layer opposite the substrate;

forming a sacrificial layer on the etch stop layer opposite the substrate wherein the sacrificial layer can be etched selectively with respect to the etch stop layer;

forming a barrier layer on the sacrificial layer opposite the substrate;

forming a mask pattern on the barrier layer to define a storage electrode contact hole;

sequentially etching the barrier layer, the sacrificial layer, the etch stop layer, the second insulating layer, and the first insulating layer using the mask pattern as a contact hole forming mask to form a contact hole for a storage electrode;

removing the mask pattern;

forming a conductive layer in the contact hole and on the barrier layer;

planarization-etching the barrier layer and the conductive layer to expose a surface portion of the sacrificial layer; and removing the sacrificial layer using the etch stop layer to stop the etch thereby forming a storage electrode electrically coupled with the semiconductor substrate.

2. The method according to claim 1, wherein said gate electrode comprises a conductive pattern and a capping layer thereon wherein the first insulating layer can be etched selectively with respect to the capping layer.

3. The method according to claim 2, wherein the capping layer comprises a silicon nitride layer.

4. The method according to claim 1, wherein the sacrificial layer and the storage electrode have a common thickness.

5. The method according to claim 1, wherein said sacrificial layer has a thickness in the range of 8,000 Å to 12,000 Å.

6. The method according to claim 1, wherein each of the etch stop layer and the barrier layer comprises a layer of a material chosen from the group consisting of polycrystalline silicon and silicon nitride.

7. The method according to claim 1, wherein each of the etch stop layer and the barrier layer has a thickness in the range of 500 Å to 1500 Å.

8. The method according to claim 1, wherein the step of forming the contact hole comprises the steps of:

etching the barrier layer using the mask pattern as a mask to expose a surface portion of the sacrificial layer to form a first opening;

etching the sacrificial layer using the etch stop layer to stop the etch;

etching the etch stop layer under a condition to form a polymer thereby forming at least one second opening having a relatively small aperture with respect to the first opening; and sequentially etching the second and first insulating layers.

9. The method according to claim 8, wherein the polymer is formed by etching the etch stop layer using an etching gas including fluorine.

10. The method according to claim 9, wherein the etching gas comprises an etching gas chosen from the group consisting of $CHF_3$ and $CF_3$.

11. The method according to claim 8, wherein said sacrificial layer comprises a material that can be selectively etched with respect to the barrier layer, and wherein the contact hole has a common width through the barrier layer and the sacrificial layer.

12. The method according to claim 1, wherein the step of planarization-etching the barrier layer is performed by on or an etch-back and a CMP (chemical-mechanical polish).

13. The method according to claim 1, wherein the step of removing the sacrificial layer is followed by the step of removing the etch stop layer.

14. The method according to claim 13, wherein the step removing the etch stop layer is performed using an anisotropic etch.

15. The method according to claim 1, further comprising the steps of:

forming a conductive layer on the etch stop layer and the storage electrode; and anisotropically etching the conductive layer and the etch stop layer to expose a top surface of the second insulating layer to increase a surface area of the storage electrode.

16. A method for fabricating a semiconductor device comprising the steps of:
forming an insulating layer on a substrate;
forming an etch stop layer on the insulating layer;
forming a sacrificial insulating layer on the etch stop layer;
forming a contact hole through the sacrificial layer, the etch stop layer and the insulating layer; and
forming a conductive plug in the contact holes;
wherein the step of forming the contact hole further comprises forming a first opening by etching the sacrificial layer using a pattern mask and forming a second opening by etching the etch stop layer and the insulating layer sequentially using the remaining sacrificial layer as a pattern mask.

17. A method according to claim 16, wherein the step of forming a conductive plug is followed by the step of removing the sacrificial layer thereby exposing upper side portions of the conductive plug to define a capacitor electrode.

18. A method according to claim 17, wherein the removing step is followed by the steps of:
forming a dielectric layer on the exposed portions of the conductive plug; and
forming a conductive layer on the dielectric layer opposite the conductive plug.

19. A method according to claim 17 wherein the step of removing the sacrificial layer is followed by the step of forming a conductive spacer on exposed portions of the conductive plug.

20. A method according to claim 17 wherein the step of removing the sacrificial layer is followed by the step of forming a hemispherical grained silicon layer on exposed portions of the conductive plug.

21. A method according to claim 16 wherein a width of the contact hole through the sacrificial layer is greater than a width of the contact hole through the first and second insulating layers.

22. A method for fabricating a semiconductor device comprising the steps of:
forming an insulating layer on a substrate;
forming an etch stop layer on the insulating layer;
forming a sacrificial insulating layer on the etch stop layer;
forming a contact hole through the sacrificial layer, the etch stop layer and the insulating layer; and
forming a conductive plug in the contact hole;
wherein the etch stop layer comprises a material that generates a polymer during the step of forming the contact hole.

23. A method according to claim 16 wherein the etch stop layer comprises a material chosen from the group consisting of polycrystalline silicon and silicon nitride.

24. A method for fabricating a semiconductor device comprising the steps of:
forming an insulating layer on a substrate;
forming an etch stop layer on the insulating layer;
forming a sacrificial insulating layer on the etch stop layer;
forming a contact hole through the sacrificial layer, the etch stop layer and the insulating layer; and
forming a conductive plug in the contact hole;
wherein the step of forming a conductive plug is followed by the step of removing the sacrificial layer thereby exposing upper side portions of the conductive plug to define a capacitor electrode;
wherein the step of removing the sacrificial layer is followed by the step of removing the etch stop layer.

25. A method according to claim 16 wherein the step of forming an insulating layer on a substrate is preceded by the step of forming a contact pad, and wherein the step of forming the contact hole reveals a top of the contact pad so as to link electrically underlying narrow conductive region with the conductive plug.

26. A method for fabricating a semiconductor device comprising the steps of:
forming an insulating layer on a substrate;
forming an etch stop layer on the insulating layer;
forming a sacrificial insulating layer on the etch stop layer;
forming a barrier layer on the sacrificial layer opposite the substrate;
after forming the barrier layer, forming a contact hole through the sacrificial layer, the etch stop layer and the insulating layer;
forming a conductive plug in the contact hole; and
after forming the conductive plug, removing the sacrificial layer thereby exposing upper side portions of the conductive plug to define a capacitor electrode wherein the step of removing the sacrificial layer includes removing the barrier layer.

27. A method according to claim 16 wherein the step of forming the conductive plug in the contact hole comprises the steps of,
forming a conductive layer in the contact hole and on the sacrificial layer, and
removing portions of the conductive layer on the sacrificial layer while maintaining portions of the conductive layer in the contact hole.

28. A method for fabricating a DRAM cell capacitor comprising the steps of:
forming a gate electrode on a semiconductor substrate;
forming a first insulating layer on the semiconductor substrate and on the gate electrode;
forming a bit line on the first insulating layer;
forming a second insulating layer on the first insulating layer and on the bit line;
forming an etch stop layer on the second insulating layer opposite the substrate;
forming a sacrifical layer on the etch stop layer wherein the sacrifical layer can be etched selectively with respect to the etch stop layer;
etching the sacrificial layer, the etch stop layer, the second insulating layer, and the first insulating layer to form a contact hole for a storage electrode;
forming a conductive layer in the contact hole and on the sacrificial insulating layer; and
planarizing the conductive layer to expose a surface portion of the sacrificial insulating layer.

29. A method according to claim 28 wherein the step of planarizing the conductive layer is followed by the step of removing the sacrificial layer thereby exposing upper side portions of the conductive plug to define a capacitor electrode.

* * * * *